United States Patent [19]
Imanaka et al.

[11] Patent Number: 5,146,295
[45] Date of Patent: Sep. 8, 1992

[54] SEMICONDUCTOR LIGHT EMITTING DEVICE HAVING A SUPERLATTICE BUFFER LAYER

[75] Inventors: Koichi Imanaka, Kyoto; Fumihiko Sato, Nagaokakyo, both of Japan

[73] Assignee: Omron Tateisi Electronic Co., Kyoto, Japan

[21] Appl. No.: 625,628

[22] Filed: Dec. 5, 1990

Related U.S. Application Data

[63] Continuation of Ser. No. 329,353, Mar. 27, 1989, abandoned.

[30] Foreign Application Priority Data

Mar. 29, 1988 [JP] Japan .................................. 63-73430

[51] Int. Cl.⁵ .............................................. H01L 27/12
[52] U.S. Cl. .......................................... 357/4; 357/16; 357/17; 372/44; 372/45
[58] Field of Search ................ 357/61, 16, 30 A, 30 B, 357/30 E, 4, 17; 372/45, 43, 44, 46

[56] References Cited

U.S. PATENT DOCUMENTS

| | | | |
|---|---|---|---|
| H095 | 7/1986 | Shanabrook et al. | 357/4 |
| 4,558,336 | 12/1985 | Chang et al. | 357/17 |
| 4,712,219 | 12/1987 | Yano et al. | 372/45 |
| 4,796,067 | 1/1989 | Shimizu et al. | 357/17 |
| 5,005,057 | 4/1991 | Izumiya et al. | 357/17 |
| 5,042,043 | 8/1991 | Hatano et al. | 372/45 |

FOREIGN PATENT DOCUMENTS

| | | | |
|---|---|---|---|
| 0236185 | 10/1986 | Japan | 372/45 |
| 62-291191 | 12/1987 | Japan | 357/17 |
| 0000170 | 1/1988 | Japan | 357/16 |
| 63-172483 | 7/1988 | Japan | 372/45 |
| 1-140790 | 6/1989 | Japan | 372/45 |
| 1-272180 | 10/1989 | Japan | 372/45 |

OTHER PUBLICATIONS

Das et al., "Variation of refractive index . . . heterostructures", Appl. Phys. lett. 58 (1), Jul. 1, 1985.
"MBE Growth of Extremely High-Quality CaAs-AlGaAs GRIN-SCH Lasers with a Superlattice Buffer Layer"; T. Fujii et al.; j. Vac. Sci. Technology B3(2), Mar./Apr. 1985, pp. 776-778.

Primary Examiner—Rolf Hille
Assistant Examiner—Minhloan Tran
Attorney, Agent, or Firm—Dickstein, Shapiro & Morin

[57] ABSTRACT

A buffer layer employed for an epitaxial growth includes two kinds of lattices of a superlattice of a lattice matching and a superlattice of a lattice mismatching or of a heterointerface so as to obtain the gas trap effect and the distortion removal effect, thereby improving the quality of the semiconductor device.

1 Claim, 2 Drawing Sheets

SEMICONDUCTOR LIGHT EMITTING DEVICE HAVING A SUPERLATTICE BUFFER LAYER

This application is a continuation of application Ser. No. 07/329,353, filed Mar. 27, 1989, now abandoned.

BACKGROUND OF THE INVENTION

1. Field of the Invention

The present invention relates to a semiconductor device which has a buffer layer on a substrate and which is produced by use of an epitaxial crystal growth method and to a method of manufacturing the device.

2. Description of the Prior Art

Conventinally, there has been reported that by providing a superlattice buffer layer of GaAs-AlGaAs on a substrate, the quality of a group III-V semiconductor device formed with atoms of group or family III and atoms of family V, and in particular, the quality of a laser of such a semiconductor device can be increased ("MBE growth of exteremely high-quality GaAs-AlGaAs GRIN-SCH lasers with a superlattice buffer layer", T. Fujii et al., j. Vac. Sci. Technol. B3 (2), Mar-/Apr 1985, pp 776-778). According to this report, when AlGaAs is grown on a GaAs substrate, or when an optical semiconductor device or an electronic device is grown thereon, a GaAs layer and an AlGaAs layer each having a layer thickness of about 15 nanometers are alernately formed several times in the AlGaAs layer so as to constitute a superlattice buffer layer, which traps or captures residual gases in the periphery of the substrate; in consequence, impurities are prevented from entering actual device layers formed thereon. It has been reported that this results in an improvement in the strength of the light emitted from a single quantum well as an actual device configured thereon, namely, 40 times the original strength.

However, the superlattice buffer layer is also not efficient as a solution against distortion or the like. For example, in a case where a light emitting element is assumed as a semiconductor device to be manufactured on a substrate so as to reduce the wavelength of the emitted wave to a short wave range, the ratio of the component of Al becomes large in the AlGaAs layer. In this situation, the difference between the coefficient of thermal expansion of the substrate and that of the AlGaAs layer becomes great, which leads to a fear that the distortion in the grown layer is increased and the reliability of the device is lowered. The superlattice buffer layer in the report is not effective for the problems above.

SUMMARY OF THE INVENTION

It is therefore an object of the present invention to provide a semiconductor device capable of achieving a trap effect of residual gases and a distortion absobing effect and to a method of manufacturing the device.

According to the present invention, there is provided a semiconductor device in which between a semiconductor substrate and a semiconductor device active portion formed thereon, there are disposed a first superlattice buffer layer (buffer layer) having a lattice mismatching or a heterointerface with respect to the substrate and a second superlattice buffer layer for which a lattice matching is developed with respect to the substrate.

According to the present invention, there is provided a method of manufacturing the semiconductor device in which when a semiconductor device is manufactured on a semiconductor substrate through an epitaxial growth, a first superlattice buffer layer and a second superlattice buffer layer are formed, said first layer including a plurality of pairs of two kinds of semiconductor layers alternately formed in which at least one of the two kinds of semiconductor layers is of a heterointerface with respect to the substrate, said second layer including a plurality of pairs of two kinds of semiconductor layers alternately formed in which the two kinds of semiconductor layers are substantially interfaced with the substrate, thereby forming a semiconductor device on said buffer layers.

The first superlattice buffer layer functions to absorb a distortion caused by a difference between the coefficient of thermal expansion of the substrate and that of the semiconductor device portion, thereby removing distortion to the outside. In addition, the second superlattice buffer layer serves to absorb residual gases and the like in the periphery of the substrate so as to increase the quality of the device portion. As described above, according to the present invention, the advantage of the conventional example can be utilized; furthermore, the problems related to the internal distortion can be solved.

DESCRIPTION OF THE PREFERRED EMBODIMENT

Figure 1:
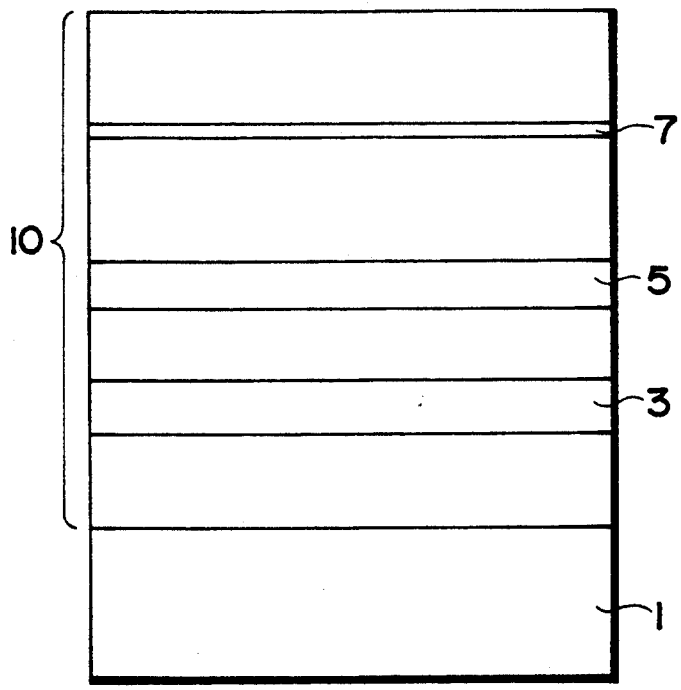
FIG. 1 is a diagram schematically showing the constitution of a semiconductor device according to the present invention.

FIG. 1 shows a constitution of a semiconductor device according to the present invention.

When a semiconductor device portion 10 is manufactured on a substrate 1 through an epitaxial growth, between an active portion 7 of the semiconductor device (for example, a carrier travel portion in an electronic device, and a recombination light emitting portion in an optical device) and the substrate 1, there are formed a first superlattice buffer layer 3 and a second superlattice buffer layer 5. The first superlattice buffer layer 3 is formed by alternately growing a plurality of pairs of two kinds of semiconductor layers. At least one of the two kinds of superlatttice layers is of a heterointerface with respect to the substrate (of the different lattice constant). In the second layer 5, two kinds of semiconductor layers are alternately formed in which the two kinds of superlattice layers are substantially interface with the substrate (substabtially of the same lattice constant). In FIG. 1, along a direction from the substrate 1 toward the active portion 7, there are formed the first superlattice buffer layer 3 and the second superlattice buffer layer 5 in this order; however, it is natual that this order may be reversed. The crystalline layer between the substrate 1 and the first superlattice buffer layer 3, that between the first superlattice buffer layer 3 and the second superlattice buffer layer 5, and that between the second superlattice buffer layer 5 and the active portion 7 may be of the same composition or of different composition. There is no limitation about thickness of the crystalline layer. The degree of the heterointerface or lattice mismatching between these crystalline layers and the substrate 1 are required to be less than the degree of the heterointerface between the substrate 1 and said at least one of the layers of the first superlattice buffer layer 3.

In the configuration above, distortions such as a distortion caused by a lattice mismatching or heterointerface between the substrate 1 and the device portion 10 and one resulted from the difference between the coefficient of thermal expansion of the substrate 1 and that of the device portion 10 are absorbed by the first superlattice buffer layer 3 such that the distortions are accumulated as an internal energy so as to be irradiated as heat or that the distortions are laterally transferred through the buffer layer 3 so as to be emitted from an end portion of the wafer to the outside. As a result, the distortions are prevented from entering the active portion 7.

In addition, residual gases in the substrate 1 and in the vicinity thereof are absorbed in the second superlattice buffer layer 5, which enables the device portion 10 to be configured with a high quality.

As a result of provision of the two kinds of superlattice lattice layers 3 and 5, a high-quality device active portion can be obtained regardless of the substrate and the crystal growth layers constituting the device.

Figure 2:
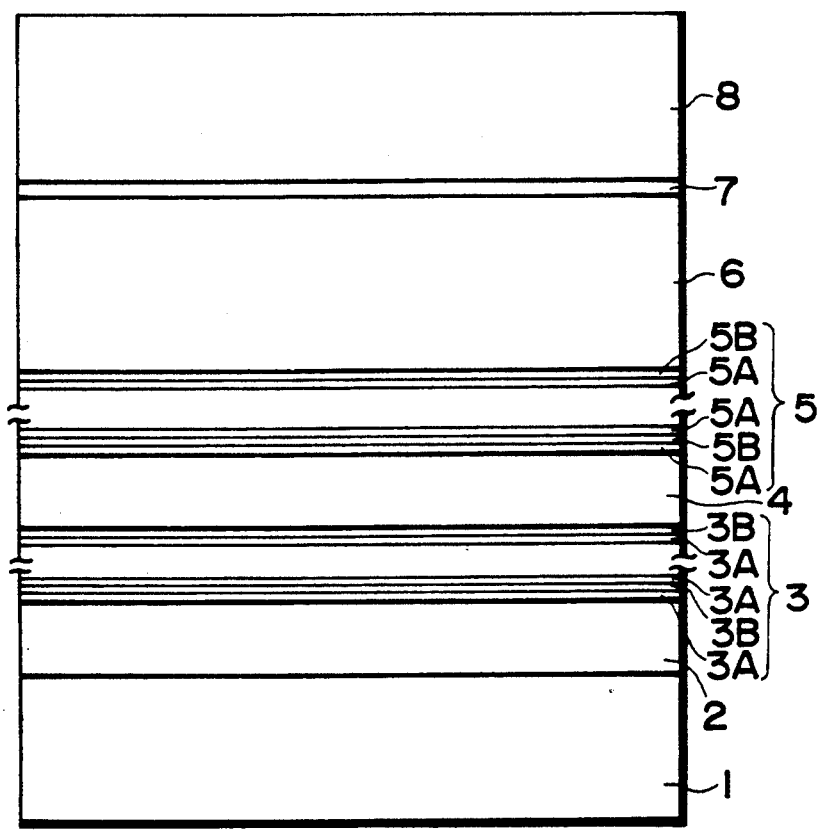
FIG. 2 is a structural diagram showing an example in which the present invention is applied to a quantum well semiconductor laser.

FIG. 2 shows an example in which the present invention is applied to a quantum well semiconductor laser.

The semiconductor laser is manufactured by sequentially effecting an epitaxial growth of such layers on an n-type GaAs substrate 1 as an n-type GaAs layer 2, a first superlattice buffer layer 3, an n-type $Al_{0.7}Ga_{0.3}As$ layer 4, a second superlattice buffer layer 5, an n-type $Al_{0.7}Ga_{0.3}As$ layer 6, a quantum well portion 7 as a light emission layer, and a p-type $Al_{0.7}Ga_{0.3}As$ layer 8. The first superlattice buffer layer 3 includes 50 pairs of layers each comprising an $In_{0.15}Ga_{0.85}As$ layer 3A which has a thickness of two molecules and which has a lattice mismatching with respect to the GaAs substrate 1 and a GaAs layer 3B having a thickness of five molecules. The second superlattice buffer layer 5 includes five pairs of layers each comprising a GaAs layer 5A which has a thickness of 50 molecules and an AlGaAs layer 5B having a thickness of 50 molecules, each of layers 5A and 5B having substantially a lattice matching with respect to the GaAs substrate 1. The quantum well portion 7 includes a GaAs layer having a thickness of 14 molecules.

In this example, as a result of a measurement of the peak strength of the photoluminescence from the quantum well portion, it is recognized that the peak value is about five times that developed in the example of the article described above. In addition, when a semiconductor laser is manufactured with the device, the efficiency of the laser is improved as follows.

(1) The current required to start the oscillation of the laser is reduced by 50%.

(2) The maximum oscillation temperature is increased by 30° C.

(3) The internal light loss is reduced by 50%.

(4) The light emission efficiency is increased by 50%.

While a particular embodiment of the present invention has been shown and described, it will be obvious to those skilled in the art that various changes and modifications may be made without departing from the present invention in its broader aspects.

What is claimed is:

1. A semiconductor device comprising:
   an n-type GaAs semiconductor substrate layer;
   a semiconductor device active GaAs layer disposed on said substrate layer;
   a first superlattice buffer layer comprising a plurality of pairs of layers each pair having, an InGaAs layer, which has a lattice mismatching quality with respect to said substrate layer, and a GaAs layer;
   a second superlattice buffer layer having a plurality of pairs of layers, each pair comprising a GaAs layer paired with an AlGaAs layer, each of said paired layers having a lattice matching quality with respect to said substrate layer; and
   where said first and second superlattice buffer layers being formed between said substrate layer and said semiconductor device active layer.

* * * * *

UNITED STATES PATENT AND TRADEMARK OFFICE
CERTIFICATE OF CORRECTION

PATENT NO. : 5,146,295
DATED : September 8, 1992
INVENTOR(S) : KOICHI IMANAKA, ET AL It is certified that error appears in the above-indentified patent and that said Letters Patent is hereby corrected as shown below:

On the title page: Item [73] Assignee's
"Omron Tateisi Electronic Co." should read --Omron Tateisi Electronics Co.--.

Signed and Sealed this

Third Day of May, 1994

Attest:

BRUCE LEHMAN

*Attesting Officer*  *Commissioner of Patents and Trademarks*